(12) United States Patent
Arai et al.

(10) Patent No.: US 10,700,191 B2
(45) Date of Patent: Jun. 30, 2020

(54) MOSFET AND POWER CONVERSION CIRCUIT

(71) Applicant: SHINDENGEN ELECTRIC MANUFACTURING CO., LTD., Chiyoda-ku, Tokyo (JP)

(72) Inventors: Daisuke Arai, Saitama (JP); Shigeru Hisada, Saitama (JP); Mizue Kitada, Saitama (JP); Takeshi Asada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/331,138

(22) PCT Filed: Sep. 16, 2016

(86) PCT No.: PCT/JP2016/077568
§ 371 (c)(1),
(2) Date: Mar. 7, 2019

(87) PCT Pub. No.: WO2018/051512
PCT Pub. Date: Mar. 22, 2018

(65) Prior Publication Data
US 2019/0214496 A1    Jul. 11, 2019

(51) Int. Cl.
*H01L 31/0312* (2006.01)
*H01L 29/78* (2006.01)
(Continued)

(52) U.S. Cl.
CPC .......... *H01L 29/7805* (2013.01); *H01L 29/06* (2013.01); *H01L 29/0634* (2013.01);
(Continued)

(58) Field of Classification Search
CPC . H01L 29/7805; H01L 29/06; H01L 29/0634; H01L 29/0878; H01L 29/68;
(Continued)

(56) References Cited

U.S. PATENT DOCUMENTS

| 2002/0117716 A1 | 8/2002 | Bosco et al. |
| 2003/0025124 A1 | 2/2003 | Deboy |

(Continued)

FOREIGN PATENT DOCUMENTS

| JP | 2003-273355 A | 9/2003 |
| JP | 2012-143060 A | 7/2012 |
| JP | 2012164707 A * | 8/2012 |

OTHER PUBLICATIONS

International Search Report in PCT/JP2016/077568, dated Nov. 29, 2016, 4pp.

(Continued)

*Primary Examiner* — David S Blum
(74) *Attorney, Agent, or Firm* — Hauptman Ham, LLP

(57) ABSTRACT

A MOSFET used in a power conversion circuit including a reactor, a power source, the MOSFET, and a rectifier element, includes a semiconductor base substrate having an n-type column region and a p-type column region, the n-type column region and the p-type column region forming a super junction structure, the n-type column region and the p-type column region are formed such that a total amount of a dopant in the p-type column region is set higher than a total amount of a dopant in the n-type column region, and the MOSFET is configured to be operated in response to turning on of the MOSFET such that at a center of the n-type column region as viewed in a plan view, a low electric field region having lower field intensity than areas of the n-type column region other than the center of the n-type column region appears.

12 Claims, 8 Drawing Sheets

(51) Int. Cl.
  *H01L 29/06* (2006.01)
  *H01L 29/08* (2006.01)
  *H01L 29/68* (2006.01)
  *H02M 1/32* (2007.01)
  *H02M 3/00* (2006.01)
  *H02M 3/156* (2006.01)
(52) U.S. Cl.
  CPC .......... *H01L 29/0878* (2013.01); *H01L 29/68* (2013.01); *H01L 29/78* (2013.01); *H01L 29/7802* (2013.01); *H01L 29/7813* (2013.01); *H02M 1/32* (2013.01); *H02M 3/00* (2013.01); *H02M 3/156* (2013.01); *H02M 2001/322* (2013.01)
(58) Field of Classification Search
  CPC . H01L 29/78; H01L 29/7802; H01L 29/7813; H02M 1/32; H02M 3/00
  USPC .......................................................... 257/77
  See application file for complete search history.

(56) References Cited

U.S. PATENT DOCUMENTS

| | | |
|---|---|---|
| 2003/0222327 A1 | 12/2003 | Yamaguchi et al. |
| 2008/0135929 A1 | 6/2008 | Saito et al. |
| 2010/0187604 A1 | 7/2010 | Ono et al. |
| 2010/0264489 A1* | 10/2010 | Ohta .................... H01L 29/0634 257/334 |
| 2011/0278650 A1* | 11/2011 | Tamaki ............. H01L 29/66681 257/288 |
| 2013/0069082 A1 | 3/2013 | Okada et al. |
| 2015/0115354 A1 | 4/2015 | Kaindl et al. |
| 2017/0338301 A1* | 11/2017 | Hu ...................... H01L 29/0634 |

OTHER PUBLICATIONS

Search Report in NL Application No. 2019484, dated Jun. 27, 2018, 12pp.

* cited by examiner

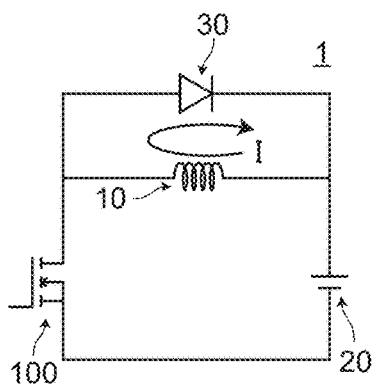
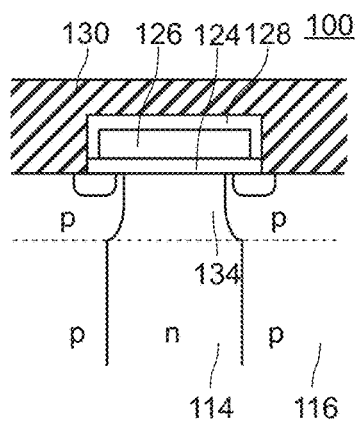
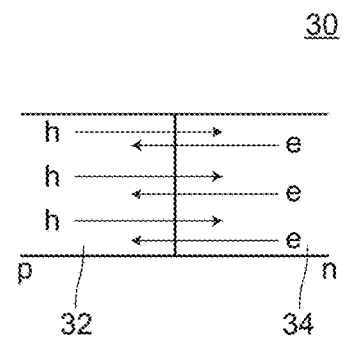
FIG.6A　　　　　FIG.6B　　　　　FIG.6C
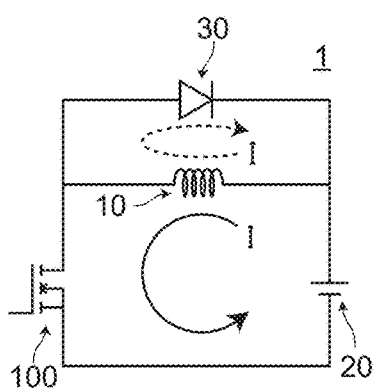
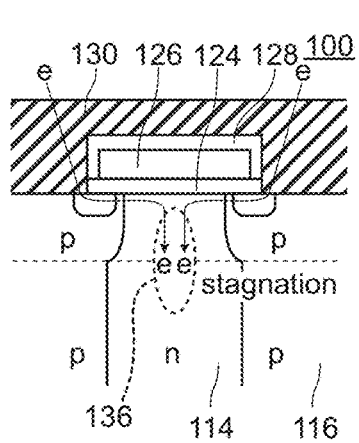
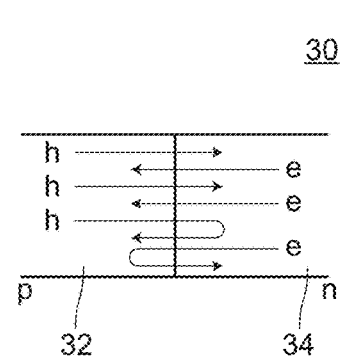
FIG.7A　　　　　FIG.7B　　　　　FIG.7C
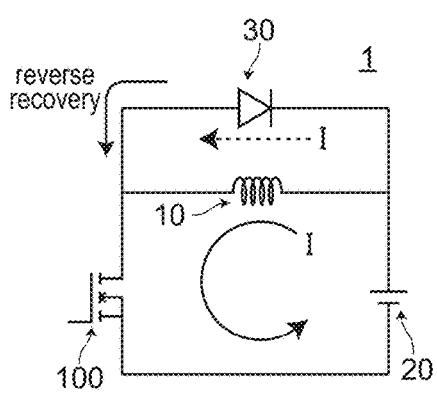
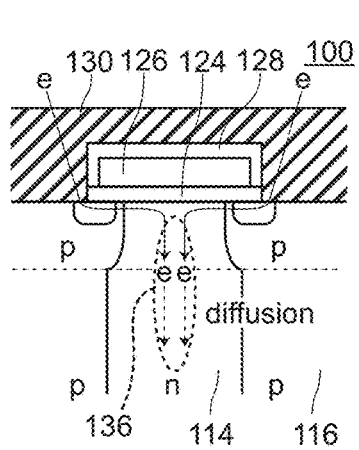
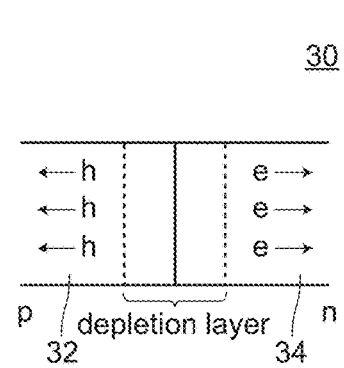
FIG.8A　　　　　FIG.8B　　　　　FIG.8C

MOSFET AND POWER CONVERSION CIRCUIT

RELATED APPLICATIONS

The present application is a National Phase of International Application Number PCT/JP2016/077568, filed Sep. 16, 2016.

TECHNICAL FIELD

The present invention relates to a Metal-Oxide Semiconductor Field-Effect Transistor (MOSFET) and a power conversion circuit.

BACKGROUND ART

Conventionally, there has been known a MOSFET which includes a semiconductor base substrate where a super junction structure is formed of an n-type column region and a p-type column region (see patent document 1, for example).

In this specification, "super junction structure" means a structure where an n-type column region and a p-type column region are alternately and repeatedly arranged as viewed in a predetermined cross section.

As shown in FIG. 14, a conventional MOSFET 900 includes: a semiconductor base substrate 910 having n-type column regions 914, p-type column regions 916, a p-type base region 918 formed on surfaces of portions of the n-type column regions 914 and whole surfaces of the p-type column regions 916, and n-type source regions 920 formed on a surface of the base region 918 and where a super junction structure is formed of the n-type column regions 914 and the p-type column regions 916; gate electrodes 926 formed on the base region 918 sandwiched between the source regions 920 and the n-type column regions 914 by way of gate insulation films 924. In FIG. 14, symbol 930 indicates a source electrode, and symbol 932 indicates a drain electrode.

In the conventional MOSFET 900, the n-type column region 914 and the p-type column region 916 are formed such that a total amount of a dopant in the n-type column regions 914 is equal to a total amount of a dopant in the p-type column regions 916. That is, the n-type column regions 914 and the p-type column regions 916 are well-balanced with each other in terms of charge.

The conventional MOSFET 900 includes the semiconductor base substrate 910 where the super junction structure is formed of the n-type column regions 914 and the p-type column regions 916 thus providing a switching element which has a low ON resistance and a high withstand voltage.

PRIOR ART DOCUMENT

Patent Document

Patent document 1: JP-A-2003-273355
Patent document 2: JP-A-2012-143060

SUMMARY OF INVENTION

Problem to be Solved by the Invention

The above-mentioned conventional MOSFET 900 is used as a switching element having a low ON resistance and a high withstand voltage and hence, the use of the MOSFET 900 in a power conversion circuit is considered (see patent document 2, for example). However, in the case where the conventional MOSFET 900 is used in the power conversion circuit, when the MOSFET is turned on, there arise problems such as easy occurrence of oscillation in the MOSFET caused by a reverse recovery current which flows into the MOSFET from a rectifier element and the increase of a surge voltage of the rectifier element.

The present invention has been made to overcome the above-mentioned problems, and it is an object of the present invention to provide a MOSFET where oscillation in the MOSFET minimally occurs compared to prior art and can decrease a surge voltage of a rectifier element compared to prior art when the MOSFET is turned on. It is another object of the present invention to provide a power conversion circuit which uses such a MOSFET.

Solution to Problem

[1] According to the present invention, there is provided a MOSFET used in a power conversion circuit which includes at least a reactor, a power source which supplies an electric current to the reactor, the MOSFET for controlling an electric current supplied from the power source to the reactor, and a rectifier element which performs a rectifying operation of the electric current supplied from the power source to the reactor or an electric current from the reactor, wherein the MOSFET includes a semiconductor base substrate having an n-type column region and a p-type column region, the n-type column region and the p-type column region forming a super junction structure, the n-type column region and the p-type column region are formed such that a total amount of a dopant in the p-type column region is set higher than a total amount of a dopant in the n-type column region, and the MOSFET is configured to be operated in response to turning on of the MOSFET such that at a center of the n-type column region as viewed in a plan view, a low electric field region having lower field intensity than an area of the n-type column region other than the center of the n-type column region appears.

In this specification, "center of the n-type column region" means an intermediate position between side walls which oppositely face each other in the n-type column region and areas around the intermediate position as viewed in a plan view.

"the n-type column region and the p-type column region are formed such that a total amount of a dopant in the p-type column region is set higher than a total amount of a dopant in the n-type column region" means that a total amount of a dopant in the p-type column region is set higher than a total amount of a dopant in the n-type column region with respect to the n-type column region and the p-type column region, that is, "the n-type column region and the p-type column region are formed such that a total amount of a dopant in the p-type column region is set higher than a total amount of a dopant in the n-type column region" means that the n-type column region and the p-type column region have the structure where a total amount of a dopant in the p-type column region is set higher than a total amount of a dopant in the n-type column region.

"the MOSFET is configured to be operated in response to turning on of the MOSFET such that at a center of the n-type column region as viewed in a plan view (of the MOSFET), a low electric field region having lower field intensity than area of the n-type column region other than the center of the n-type column region appears" means that the MOSFET (for example, the structure, size, shape, dopant concentration of the n-type column region, dopant concentration of the p-type column region or the like) is configured, in response to turning on of the MOSFET, at the center of the n-type column region as viewed in a plan view (of the MOSFET), a low electric field region having lower field intensity than areas of the n-type column region other than the center of the n-type column region appears.

In this specification, even when other structures (regions) are formed on surfaces of the n-type column region and the p-type column region, it is assumed that portions where such other structures (for example, a base region, a source region, a surface high concentration diffusion region and the like) are formed also form the n-type column region and the p-type column region.

[2] In the MOSFET of the present invention, it is preferable that the total amount of the dopant in the p-type column region be set in a range of 1.05 times to 1.15 times as much as the total amount of the dopant in the n-type column region.

[3] In the MOSFET of the present invention, it is preferable that the semiconductor base substrate further include: a p-type base region formed on a surface of a portion of the n-type column region and a whole surface of the p-type column region; and an n-type source region formed on a surface of the base region, and the MOSFET be a planar-gate-type MOSFET which further includes a gate electrode formed on the base region sandwiched between the source region and the n-type column region by way of a gate insulation film.

[4] In the MOSFET of the present invention, it is preferable that the semiconductor base substrate further include an n-type surface high concentration diffusion region formed on a portion of the surface of the n-type column region where the base region is not formed.

[5] In the MOSFET of the present invention, it is preferable that the semiconductor base substrate further include: a p-type base region formed on a surface of the n-type column region and a surface of the p-type column region; and an n-type source region formed on a surface of the base region, and the MOSFET be a trench-gate-type MOSFET which further includes: a trench where the trench is formed so as to reach a depth position deeper than a deepest portion of the base region in a region where the n-type column region is positioned as viewed in a plan view, and a portion of the source region is exposed on an inner peripheral surface of the trench; and a gate electrode embedded in the inside of the trench by way of a gate insulation film formed on the inner peripheral surface of the trench.

[6] In the MOSFET according to the present invention, it is preferable that the semiconductor base substrate have an n-type high concentration dopant region which is formed in a region deeper than a bottommost portion of the base region and shallower than a bottommost portion of the trench.

[7] In the MOSFET of the present invention, it is preferable that the p-type column region have the structure where a width of the p-type column region is gradually increased as the p-type column region extends from a deep portion of the p-type column region toward a surface of the p-type column region.

[8] In the MOSFET of the present invention, it is preferable that the p-type column region have the structure where dopant concentration in the p-type column region is gradually increased as the p-type column region extends from a deep portion of the p-type column region toward a surface of the p-type column region.

[9] In the present invention, there is provided a power conversion circuit including at least: a reactor; a power source which supplies an electric current to the reactor; the MOSFET according to any one of claims 1 to 8 for controlling an electric current supplied from the power source to the reactor, and a rectifier element which performs a rectifying operation of the electric current supplied from the power source to the reactor or an electric current from the reactor.

[10] In the power conversion circuit of the present invention, it is preferable that the rectifier element be a fast recovery diode.

[11] In the power conversion circuit of the present invention, it is preferable that the rectifier element be a built-in diode of the MOSFET.

[12] In the power conversion circuit of the present invention, it is preferable that the rectifier element be a silicon-carbide Schottky barrier diode.

Advantageous Effects of the Present Invention

According to the MOSFET and the power conversion circuit of the present invention, the MOSFET is configured to be operated in response to turning on of the MOSFET such that at a center of the n-type column region as viewed in a plan view, a low electric field region having lower field intensity than areas of the n-type column region other than the center of the n-type column region appears (see FIG. 4A described later). Accordingly, electrons in the low electric field region minimally move and hence, an increment of a drain current per unit time can be made small. As a result, even when a reverse recovery current from a rectifier element flows into the MOSFET, it is possible to make oscillation in the MOSFET minimally occur and, at the same time, a surge voltage of the rectifier element can be decreased.

Further, according to the MOSFET and the power conversion circuit of the present invention, the n-type column region and the p-type column region are formed such that a total amount of a dopant in the p-type column region is set higher than a total amount of a dopant in the n-type column region. Accordingly, (1) when the MOSFET is turned off, the n-type column region is easily depleted and hence, a time necessary for turning off the MOSFET can be shortened whereby a turn-off loss can be made small. Further, (2) when the MOSFET is turned off, holes in the n-type column region can be easily extracted to the source electrode and hence, it is possible to make avalanche breakdown minimally occur.

According to the MOSFET and the power conversion circuit of the present invention, the MOSFET has the super junction structure where the n-type column region and the p-type column region are alternately arranged. Accordingly, in the same manner as the conventional MOSFET 900, it is possible to provide a switching element having low ON resistance and high withstand voltage.

BRIEF DESCRIPTION OF DRAWINGS

FIG. 3A is the graph showing a time transition simulation result of the drain current Id and the drain-source voltage Vds when the MOSFET is turned on, and FIG. 3B is the graph showing a time transition simulation result of the gate-source voltage Vgs when the MOSFET is turned on. The MOSFET of the present invention example is the MOSFET 100 according to Embodiment 1, and the MOSFET of Comparative example is a MOSFET where a total amount of a dopant in an n-type column region is equal to a total amount of a dopant in a p-type column region in the same manner as a conventional MOSFET 900. A power source voltage for the power conversion circuit 1 is set to 300V.

FIG. 4A to FIG. 4C are views showing field intensity of an n-type column region 114 when the MOSFET is turned on. FIG. 4A is the view showing field intensity of the n-type column region 114 at a point of time (A) in FIG. 3A, FIG. 4B is the view showing field intensity of the n-type column region 114 at a point of time (B) in FIG. 3A, FIG. 4C is the view showing field intensity of the n-type column region 114 at a point of time (C) in FIG. 3A. Lower ends of FIG. 4A to FIG. 4C indicate a boundary surface between a low-resistance semiconductor layer 112 and a buffer layer 113, and left and right ends of FIG. 4A to FIG. 4C indicate intermediate positions of side walls of a p-type column region 116 which are disposed opposite to each other. In FIG. 4A to FIG. 4C, a black dotted line indicates a boundary between the p-type column region 116 and a base region 118 and an n n-type column region, a white dotted line indicates a boundary between an area where an amount of carriers becomes 5% or less of an amount of carriers in a normal time and areas other than such an area, and an area surrounded by a black chain line indicates a low electric field region 136 (same definition being adopted in FIG. 5A to FIG. 5C).

FIG. 5A to FIG. 5C are views showing electron density of the n-type column region 114 when the MOSFET is turned on. FIG. 5A is the view showing electron density of the n-type column region 114 at a point of time (A) in FIG. 3A, FIG. 5B is the view showing electron density of the n-type column region 114 at a point of time (B) in FIG. 3A, FIG. 5C is the view showing electron density of the n-type column region 114 at a point of time (C) in FIG. 3A.

FIG. 6A to FIG. 6C are views showing operational states of a power conversion circuit 1, the MOSFET 100, and a rectifier element 30 when the MOSFET 100 is in an OFF state. FIG. 6A is a circuit diagram showing an operational state of the power conversion circuit 1, FIG. 6B is a view showing an operational state of the MOSFET 100, and FIG. 6C is a view showing an operational state of the rectifier element 30 (the same understanding being adopted in FIG. 7A to FIG. 9C).

FIG. 7A to FIG. 7C are views showing operational states of the power conversion circuit 1, the MOSFET 100, and the rectifier element 30 in a first half of a turn-on period when the MOSFET is turned on.

FIG. 8A to FIG. 8C are views showing operational states of the power conversion circuit 1, the MOSFET 100, and the rectifier element 30 in a second half of the turn-on period when the MOSFET is turned on.

In FIG. 10, symbol 40 indicates a load, and symbol 50 indicates a capacitor.

In FIG. 11, symbol 40 indicates a load, and symbol 50 indicates a capacitor.

DESCRIPTION OF EMBODIMENTS

Figure 1:
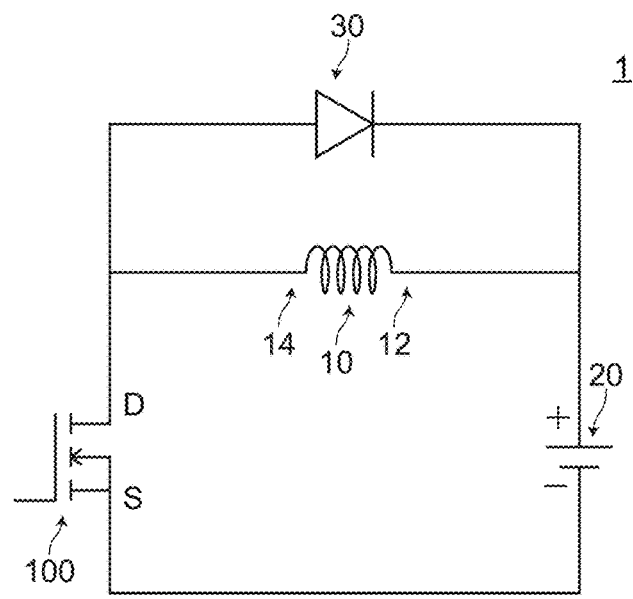
FIG. 1 is a circuit diagram showing a power conversion circuit 1 according to Embodiment 1.

Hereinafter, a MOSFET and a power conversion circuit according to the present invention are described in accordance with embodiments shown in the drawings. The respective drawings are schematic drawings, and do not always strictly reflect actual sizes of the MOSFET and the power conversion circuit.

Embodiment 1

1. Structure and Operation of Power Conversion Circuit 1 According to Embodiment 1

A power conversion circuit 1 according to Embodiment 1 is a chopper circuit which is a constitutional element such as a DC-DC converter or an inverter. The power conversion circuit 1 according to Embodiment 1 includes, as shown in FIG. 1, a reactor 10, a power source 20, a MOSFET 100, and a rectifier element 30. The MOSFET 100 is the MOSFET 100 according to Embodiment 1.

The reactor 10 is a passive element which can store energy in a magnetic field generated by an electric current which flows through the reactor 10.

The power source 20 is a DC power source which supplies an electric current to the reactor 10.

The MOSFET 100 controls an electric current supplied from the power source 20 to the reactor 10. To be more specific, the MOSFET 100 is switched to assume an ON state in response to a signal (clock signal, for example) applied from a drive circuit (not shown in the drawing) to a gate electrode of the MOSFET 100, and electrically interconnects the reactor 10 and a negative pole of the power source 20. The specific structure of the MOSFET 100 is described later.

The rectifier element 30 is a fast recovery diode which performs a rectifying operation of an electric current supplied from the power source 20 to the reactor 10. To be more specific, the rectifier element 30 is a lifetime-controlled PIN diode.

A positive pole (+) of the power source 20 is electrically connected to one end 12 of the reactor 10 and a cathode electrode of the rectifier element 30, and a negative pole (−) of the power source 20 is electrically connected to a source electrode of the MOSFET 100. A drain electrode of the MOSFET 100 is electrically connected to the other end 14 of the reactor 10 and an anode electrode of the rectifier element 30.

In such a power conversion circuit 1, when the MOSFET 100 is in an OFF state, an electric current which flows through an electric current path from a positive pole (+) of the power source 20 to the negative pole (−) of the power source 20 through the reactor 10 and the MOSFET 100 becomes 0 (see FIG. 6A). On the other hand, the reactor 10 generates an electromotive force in a direction in which a change in an electric current is obstructed (electric energy stored in the reactor 10 is discharged) due to a self induction effect. An electric current generated due to an electromotive force of the reactor 10 advances toward the rectifier element 30, and a forward electric current flows in the rectifier element 30 (see FIG. 6A).

Figure 9A:
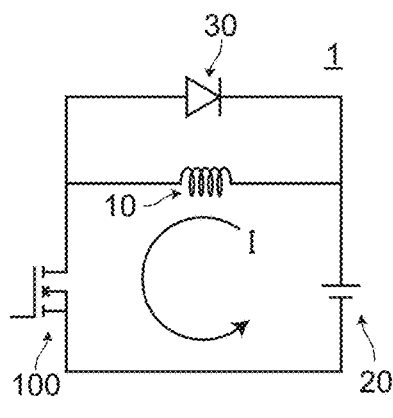
FIG. 9A to FIG. 9C are views showing operational states of the power conversion circuit 1, the MOSFET 100, and the rectifier element 30 when the MOSFET is in an ON state.

When the MOSFET 100 is in an ON state, the electric current path from a positive pole (+) of the power source 20 to the negative pole (−) of the power source 20 through the reactor 10 and the MOSFET 100 is formed, and an electric current flows through the electric current path (see FIG. 9A). In this case, electric energy of the power source 20 is stored in the reactor 10.

A sum of an amount of an electric current which flows through the MOSFET 100 and an amount of an electric current which flows through the rectifier element 30 is equal to an amount of an electric current which flows through the reactor 10. A switching period of the MOSFET 100 is short (possibly 100 nanoseconds at maximum) and hence, an amount of an electric current which flows through the reactor 10 minimally changes during such a period. Accordingly, a sum of an amount of an electric current which flows through the MOSFET 100 and an amount of an electric current which flows through the rectifier element 30 minimally changes in either case, that is, an OFF state, a turn-on period or an ON state.

2. Structure of MOSFET 100 According to Embodiment 1

Figure 2:
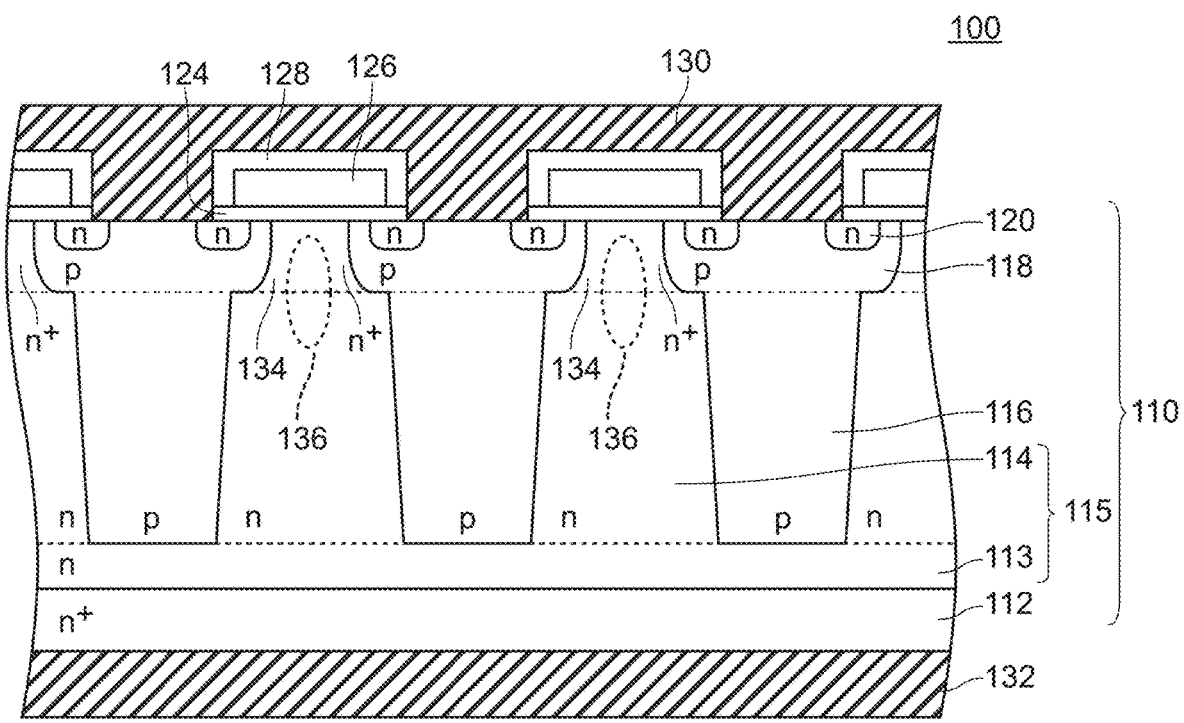
FIG. 2 is a cross-sectional view of a MOSFET 100 according to Embodiment 1.

As shown in FIG. 2, the MOSFET 100 according to the Embodiment 1 is a planar-gate-type MOSFET which includes a semiconductor base substrate 110, a gate insulation film 124, a gate electrode 126, an interlayer insulation film 128, a source electrode 130, and a drain electrode 132. A drain-source withstand voltage of the MOSFET 100 is 300V or more, for example, 600V.

The semiconductor base substrate 110 has a low-resistance semiconductor layer 112, an n-type buffer layer 113 formed on the low-resistance semiconductor layer 112 and having lower dopant concentration than dopant concentration of the low-resistance semiconductor layer 112, n-type column regions 114 and p-type column regions 116 formed on the buffer layer 113 where the n-type column region 114 and the p-type column region 116 are alternately arranged along a horizontal direction, p-type base regions 118 formed on surfaces of portions of the n-type column regions 114 and whole surfaces of the p-type column regions 116, n-type source regions 120 formed on surfaces of the base regions 118, and n-type surface high concentration diffusion regions 134 each of which is formed on a portion of the surface of the n-type column region 114 where the base region 118 is not formed, wherein the n-type column regions 114 and the p-type column regions 116 form a super junction structure. The buffer layer 113 and the n-type column regions 114 are integrally formed, and the buffer layer 113 and the n-type column region 114 form an n-type semiconductor layer 115.

In the semiconductor base substrate 110, the n-type column region 114 and the p-type column region 116 are formed such that a total amount of a dopant in the p-type column region 116 is higher than a total amount of a dopant in the n-type column region 114. To be more specific, a total amount of a dopant in the p-type column region 116 is set in a range of 1.05 times to 1.15 times as much as a total amount of a dopant in the n-type column region 114. For example, a total amount of a dopant in the p-type column region 116 is set to 1.10 times as much as a total amount of a dopant in the n-type column region 114.

"total amount of a dopant" means a total amount of a dopant (an n-type dopant or a p-type dopant) in a constitutional element (the n-type column region or the p-type column region) in the MOSFET.

The p-type column region 116 has the structure where a width of the p-type column region 116 is gradually increased as the p-type column region 116 extends from a deep portion of the p-type column region 116 toward a surface of the p-type column region 116. Dopant concentration in the p-type column region is set to a fixed value regardless of a depth of the p-type column region 116.

All of the n-type column regions 114, the p-type column regions 116, the source regions 120, and the gate electrodes 126 are formed in a stripe shape as viewed in a plan view.

A thickness of the low-resistance semiconductor layer 112 falls in a range of 100 μm to 400 μm and, for example, dopant concentration in the low-resistance semiconductor layer 112 falls in a range of $1\times10^{19}$ cm$^{-3}$ to $1\times10^{20}$ cm$^{-3}$, for example. A thickness of the n-type semiconductor layer 115 falls in a range of 5 μm to 120 μm, for example. Dopant concentration in the n-type semiconductor layer 115 falls in a range of $5\times10^{13}$ cm$^{-3}$ to $1\times10^{16}$ cm$^{-3}$, for example. Dopant concentration in the p-type column region 116 falls in a range of $5\times10^{13}$ cm$^{-3}$ to $1\times10^{16}$ cm$^{-3}$, for example. A depth position of a deepest portion of the base region 118 falls in a range of 1.0 μm to 3.0 μm, for example, and dopant concentration in the base region 118 falls in a range of $5\times10^{16}$ cm$^{-3}$ to $1\times10^{18}$ cm$^{-3}$, for example. A depth position of a deepest portion of the source region 120 falls in a range of 0.1 μm to 0.4 μm, for example, and dopant concentration in the source region 120 falls in a range of $5\times10^{19}$ cm$^{-3}$ to $2\times10^{20}$ cm$^{-3}$, for example. A depth position of a deepest portion of the surface high concentration diffusion region 134 falls in a range of 1.0 μm to 3.0 μm, for example, and dopant concentration in the surface high concentration diffusion region 134 falls in a range of $1\times10^{14}$ cm$^{-3}$ to $1\times10^{16}$ cm$^{-3}$, for example. A surface of the semiconductor base substrate 110 forms an upper end of the n-type semiconductor layer 115 and upper end of the p-type column region 116.

The gate electrode 126 is formed on the base region 118 sandwiched between the source region 120 and the n-type column region 114 with the gate insulation film 124 interposed between the gate electrode 126 and the base region 118. The gate insulation film 124 is formed of a silicon dioxide film which is formed by a thermal oxidation method and the gate insulation film 124 has a thickness of 100 nm, for example. The gate electrode 126 is formed by a CVD method and an ion implantation method and is made of low-resistance polysilicon.

The interlayer insulation film 128 is formed so as to cover the gate electrode 126. The interlayer insulation film 128 is formed by a CVD method and is formed of a PSG film.

The source electrode 130 is formed so as to cover the base region 118, a portion of the source region 120, and the interlayer insulation film 128. The source electrode 130 is electrically connected with the base region 118 and the source region 120. The drain electrode 132 is formed on a surface of the low-resistance semiconductor layer 112. The source electrode 130 is made of aluminum-based metal (Al-cu-based alloy, for example) having a thickness of 4 μm formed by, for example, a sputtering method. A total thickness of the multi-layered metal film is 0.5 μm, for example.

The MOSFET (for example, dopant concentration of the n-type column region 114, dopant concentration of the p-type column region 116 or the like) according to Embodiment 1 is configured such that, in response to turning on of the MOSFET, at the center of the n-type column region 114 as viewed in a plan, a low electric field region 136 having lower field intensity than areas of the n-type column region 114 other than the center of the n-type column region 114 appears.

Low electric field region 136 appears just below the gate electrode 126 (just below the center of the gate electrode 126) as viewed in a plan view. The low electric field region 136 is positioned at an intermediate position between the base regions 118 disposed adjacently to each other as viewed in a plan view. Electrons stagnate in the low electric field region 136, and the electrons move to a drain electrode side by diffusion.

3. Waveform and Operation of MOSFET 100 when MOSFET is Turned On

To describe the MOSFET according to Embodiment 1, a MOSFET according to a Comparative example is described first.

The MOSFET according to Comparative example basically has the structure which is substantially same to the structure of the MOSFET 100 according to Embodiment 1. However, the MOSFET according to Comparative example differs from the MOSFET 100 according to Embodiment 1 with respect to a point that, in the MOSFET according to Comparative example, the n-type column region and the p-type column region are formed such that a total amount of a dopant in the p-type column region becomes equal to a total amount of a dopant in the n-type column region.

Figure 3A:
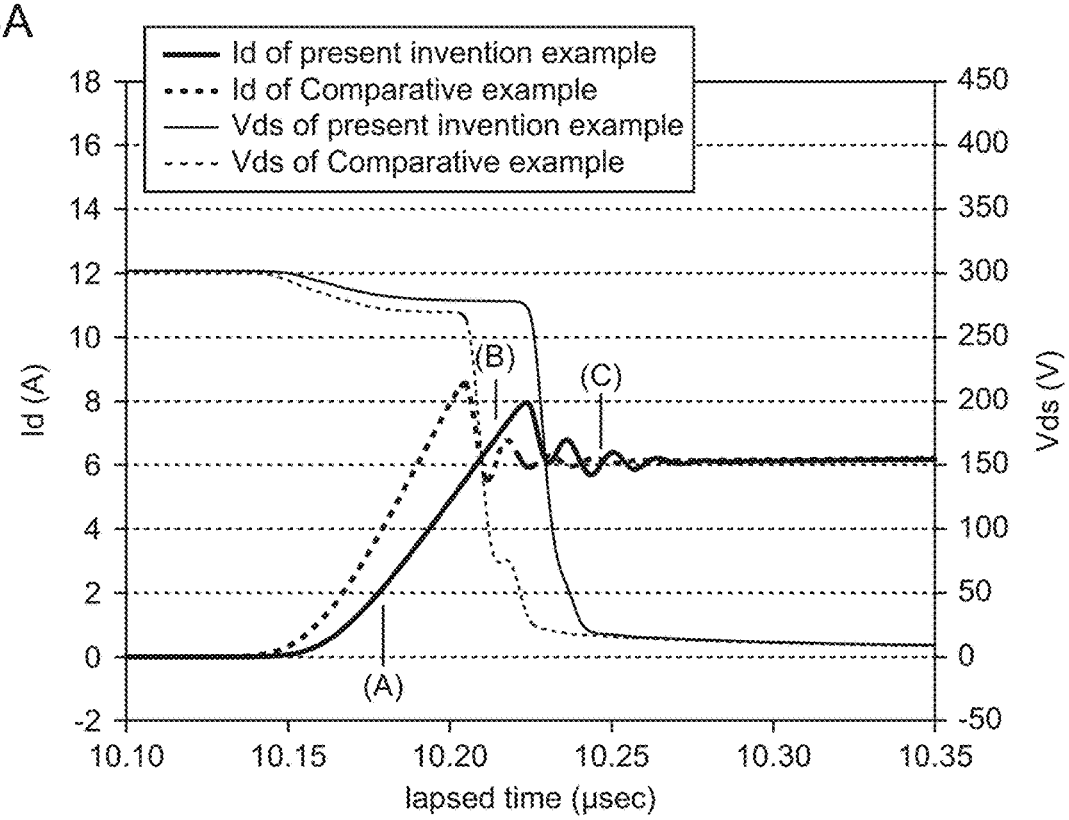
FIG. 3A and FIG. 3B are graphs showing a time transition simulation result of a drain current Id, a drain-source voltage Vds, and a gate-source voltage Vgs when a MOSFET is turned on in the power conversion circuit 1 according to Embodiment 1.

In the power conversion circuit 1 according to Embodiment 1, when the MOSFET according to Comparative example is used in place of the MOSFET 100, the MOSFET according to Comparative example is operated such that, when the MOSFET is turned on, a drain current Id is increased to approximately 8.5 A within a relatively short period (approximately 0.05 μsec) (that is, the MOSFET according to Comparative example is operated such that the drain current Id is sharply increased, see a bold dotted line in FIG. 3A). Then, the MOSFET according to Comparative example is operated such that the drain current Id oscillates first with a relatively large amplitude after the drain current Id reaches a peak and, thereafter, the drain current Id attenuates and becomes stable at approximately 6 A.

Further, the MOSFET according to Comparative example is operated such that a drain-source voltage Vds is sharply lowered from 300V to approximately 50V or less (see a fine dotted line in FIG. 3A).

Figure 3B:
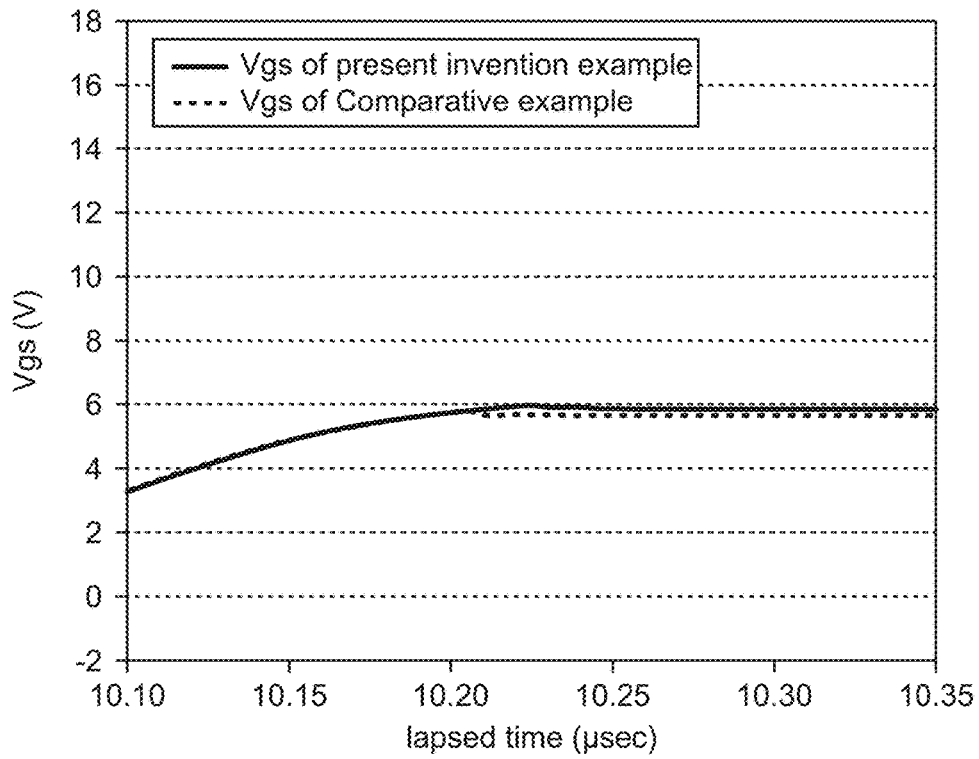

Still further, the MOSFET according to Comparative example is operated such that the gate-source voltage Vgs monotonously increases and becomes stable at approximately 6V (see a bold dotted line in FIG. 3B).

On the other hand, in the power conversion circuit 1 according to Embodiment 1 which uses the MOSFET 100 according to Embodiment 1 (hereinafter, referred to as MOSFET according to the present invention example), the MOSFET according to the present invention example is operated such that, when the MOSFET is turned on, a drain current Id is increased to approximately 8 A within a relatively long period (approximately 0.08 μsec) (that is, the MOSFET according to the present invention example is operated such that the drain current Id is moderately increased, see a bold solid line in FIG. 3A) compared to the case where the MOSFET according to Comparative example is used. Then, the MOSFET according to the present invention example is operated such that the drain current Id oscillates first with amplitude smaller than the amplitude of the drain current Id in the MOSFET according to Comparative example after the drain current Id reaches a peak and, thereafter, the drain current Id attenuates and becomes stable at approximately 6 A.

Further, the MOSFET according to the present invention example is operated such that a drain-source voltage Vds is sharply lowered to approximately 50V or less at the timing later than the corresponding timing in the MOSFET according to Comparative example (see a fine solid line in FIG. 3A).

Still further, the MOSFET according to the present invention example is operated such that the gate-source voltage Vgs monotonously increases and becomes stable at approximately 6V in the same manner as the MOSFET according to Comparative example (see a bold solid line in FIG. 3B).

Figure 4A:
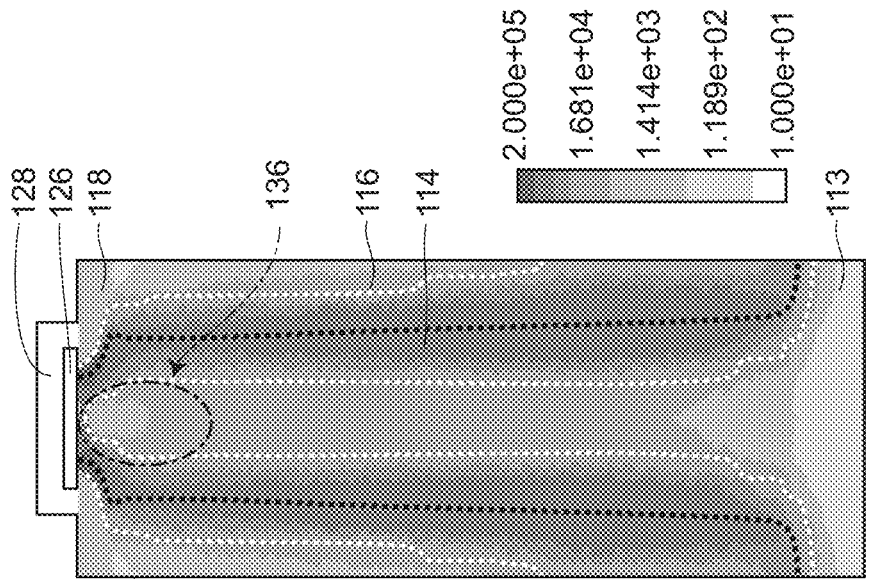

The MOSFET according to the present invention example is operated such that, in response to turning on of the MOSFET, at the center of the n-type column region 114 as viewed in a plan view (in the vicinity of a surface of the n-type column region 114 at the center of the n-type column region 114 as viewed in cross section), the low electric field region 136 having lower field intensity than areas of the n-type column region 114 other than the center of the n-type column region 114 appears (see FIG. 4A). The low electric field region 136 plays a role of suppressing the rise of an electric current by making electrons stagnate in a first half of a turn-on period. In a second half of the turn-on period, a potential difference between a drain and a source of the MOSFET is decreased and hence, field intensity becomes also small as a whole. However, as a region having a smaller field intensity than the surrounding around the low electric field region 136, the low electric field region 136 still remains at substantially the same position as the first half of the turn-on period (see FIG. 4B), and continues to play the role of suppressing a rate of increase in an electric current per unit time.

Figure 4B:
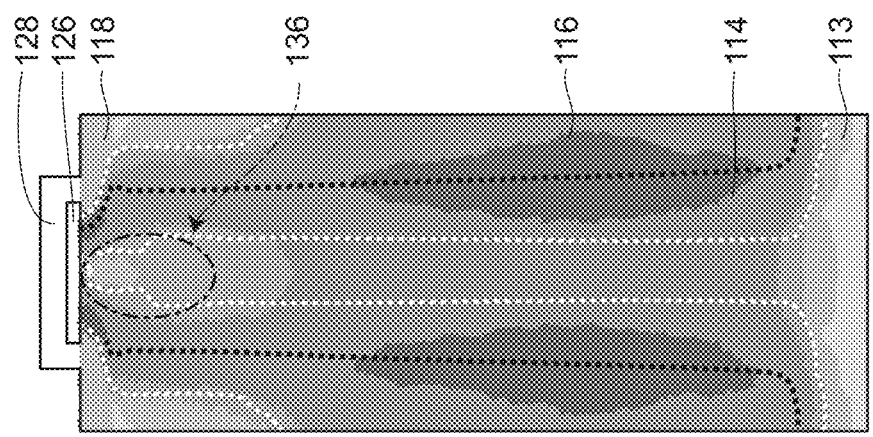
Figure 4C:
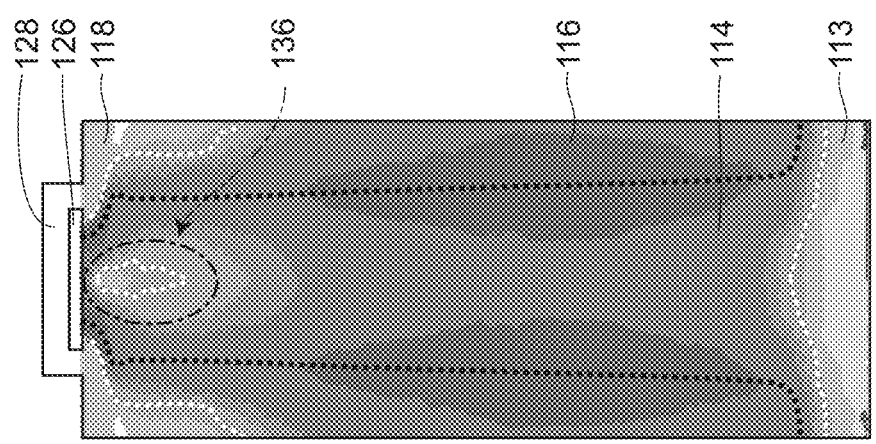

Then, when the turn-on period is completed and a steady state reaches (the steady state being achieved after a drain current Id performs ringing at this stage of operation), a low electric field region where field intensity is particularly small compared to the surrounding around the low electric field region is not recognized at the center of an upper portion of the n-type column region 114, and the low electric field region 136 is extinguished substantially simultaneously with the completion of turn-on of the MOSFET. FIG. 4C shows a state of the MOSFET in the last period of the turn-on period. In this state, a drain-source voltage remains at a level of approximately 20V and hence, this state is a state just before the MOSFET reaches a steady ON state. The difference between field intensity of the low electric field region 136 becomes small compared to field intensity in the surrounding around the low electric field region 136. Although the low electric field region 136 is being extinguished, the slight low electric field region 136 remains.

Figure 5C:
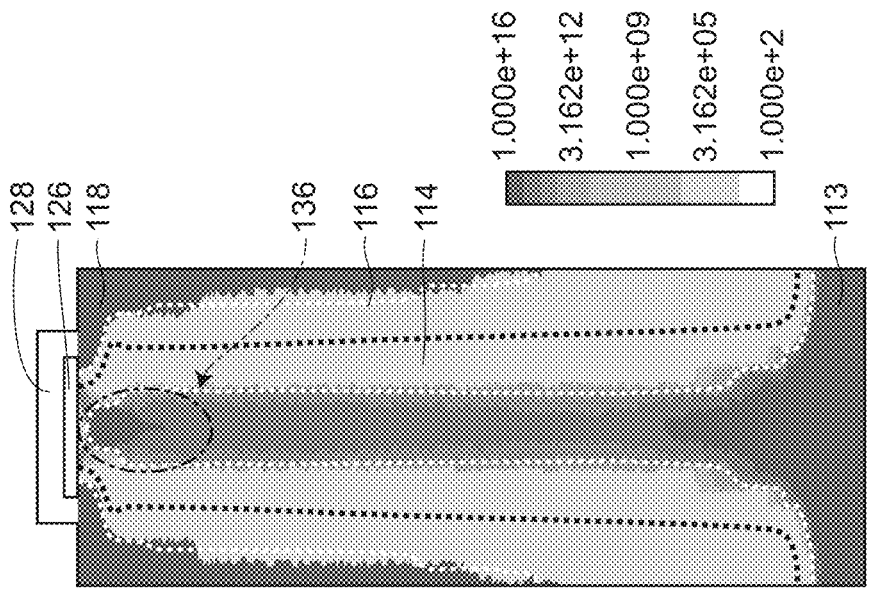

The MOSFET according to the present invention example is, as described above, operated such that, in response to turning on of the MOSFET, at the center of the n-type column region 114 as viewed in a plan (in the vicinity of the surface of the n-type column region 114 at the center of the n-type column region 114 as viewed in cross section), the low electric field region 136 having lower field intensity than areas of the n-type column region 114 other than the center of the n-type column region 114 appears (see FIG. 4A). A Coulomb force which acts on electrons is small in the low electric field region 136 and hence, electrons which flow from the source electrode into the region 136 stagnate in the low electric field region 136 (see FIG. 5A). Electrons which stagnate in the low electric field region 136 can flow but only as a diffusion current due to a gradient of electron density and hence, electrons flow out little by little to a side close to the drain electrode 132 (at lower sides in FIG. 4A to FIG. 4C and FIG. 5A to FIG. 5C) due to diffusion. Electrons which flow to the outside of the low electric field region 136 are accelerated in a direction toward the drain electrode 132 by an electric field present outside the low electric field region 136 and flow as a drift current and reach the drain electrode 132.

Figure 5B:
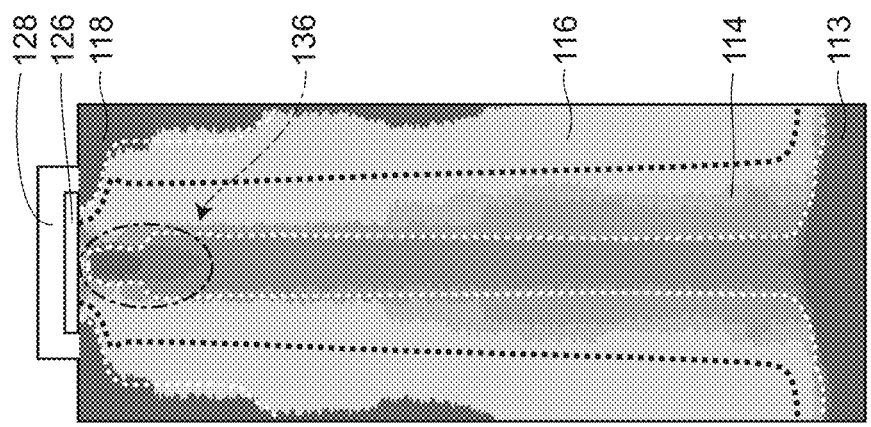
Figure 5A:
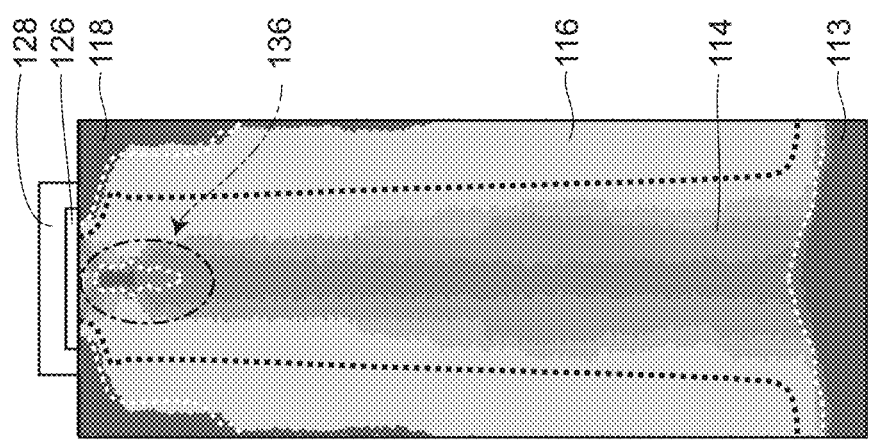

In the second half of the turn-on period, electron density of electrons which stagnate in the low electric field region 136 is further increased so that a gradient of electron density is also increased whereby an amount of a diffused current which flows out in a lower direction (direction toward the drain electrode) from the low electric field region 136 is increased compared to the first half of the turn-off period. Electrons which flow out to the outside of the low electric field region 136 are accelerated by an electric field present outside the low electric field region 136, flow as a drift current and reach the drain electrode 132. In this manner, in the n-type column region 114, the low electric field region 136 is formed at the center of the upper portion of the n-type column region 114, and a path of a drift current is formed between a lower end of the low electric field region 136 and the drain electrode 132 (see FIG. 5B). In FIG. 4B and FIG. 5B, the region indicated by a white dotted line expands toward a lower side of the low electric field region 136 (drain electrode side). This is because, with the increase of an electric current, a region where electron density exceeds 5% of electron density in a normal time (non-biased time) is expanded.

Then, when the turn-on of the MOSFET according to the present invention is completed and assumes a steady state, a drain-source potential difference agrees with an ON voltage of the MOSFET. Then, in a region ranging from a drain electrode side to a source electrode side, a uniform electric field substantially equal to an average field intensity (a value obtained by dividing an ON voltage by a region depth of the n-type column region 114) is generated, and electrons flow as a drift current from the source electrode to the drain electrode.

In an ON state where turn-on of the MOSFET is completed, to compare with the turn-on period, drain-source potential difference is small and hence, average field intensity also becomes small. As a result, a low electric field region having a particularly small field intensity is not recognized at the center of the upper portion of the n-type column region 114 compared to the surrounding around the center of the upper portion of the n-type column region 114, and the low electric field region 136 is extinguished substantially simultaneously with the completion of the turn-on of the MOSFET. When the source electrode and the drain electrode 132 are electrically connected in an ON state, electrons flow over the whole region of the path as a drift current, and a region where electron density is high expands also in a width direction of the n-type column region 114. In FIG. 5C, an electron current flows using a wide width of the n-type column region 114 thus approaching a steady ON state (see FIG. 5C).

4. Manner of Operations of Power Conversion Circuit 1, MOSFET 100 and Rectifier Element 30

(1) OFF State

In the power conversion circuit 1, an electric current which flows through the electric current path from the positive pole (+) of the power source 20 to the negative pole (−) of the power source 20 via the reactor 10 and the MOSFET 100 becomes (see FIG. 6A). On the other hand, an electric current generated due to an electromotive force of the reactor 10 goes toward the rectifier element 30, and a forward electric current flows in the rectifier element 30.

In the MOSFET 100, a gate-source voltage Vgs becomes less than a gate threshold value voltage and hence, a channel disappears whereby a drain current Id becomes 0 (see FIG. 6B). In the rectifier element 30, holes move from a p-type semiconductor region 32 of an anode electrode side to an n-type semiconductor region 34 of a cathode electrode side, and electrons move from the n-type semiconductor region 34 of a cathode electrode side to the p-type semiconductor region 32 of an anode electrode side (see FIG. 6C).

(2) First Half of Turn-on Period

When the MOSFET is turned on, in the power conversion circuit 1, the electric current path, from the positive pole (+) of the power source 20 to the negative pole (−) of the power source 20 through the reactor 10 and the MOSFET 100, is formed, and an electric current starts to flow through the electric current path (see FIG. 7A). In this case, a forward electric current which flows in the rectifier element 30 starts to decrease by an amount equal to an amount of an electric current which flows in the MOSFET 100. A sum of an amount of an electric current which flows in the MOSFET 100 and an amount of an electric current which flows in the rectifier element 30 is held at a fixed value.

In the MOSFET 100, electrons flow in the n-type column region 114 from the source electrode 130 via the source regions 120. In this embodiment, in the MOSFET 100, at the center of the n-type column region 114 as viewed in a plan view, the low electric field region 136, having lower field intensity than areas of the n-type column region 114 other than the center of the n-type column region 114, appears. Accordingly, electrons which enter from a source electrode 130 side hardly move in the low electric field region 136 and hence, electrons stagnate in the low electric field region 136 (see FIG. 7B). An electric current (drain-source current) which flows in the MOSFET is generated by an electron current and hence, when the above-mentioned stagnation of electrons occurs, the number of electrons which contribute to the generation of an electric current which reaches the drain from the source is decreased. As a result, the rise of an electric current per unit time is deteriorated. That is, an increment per unit time of Id in the present invention example shown in FIG. 3A becomes smaller than an increment per unit time of Id in Comparative example (see a bold solid line in FIG. 3A).

In the rectifier element 30, although an electric current has been flowing in a forward direction via a PN junction, a portion of holes which has diffused into the cathode electrode from the anode electrode starts to return to the anode electrode. On the other hand, a portion of electrons which diffuse into the anode electrode from the cathode electrode starts to return to the cathode electrode. A forward electric current is decreased due to the movement of such carriers (electrons and holes) (see FIG. 7C).

(3) Second Half of Turn-on Period

Also in the second half of the turn-on period, in the power conversion circuit 1, in the same manner as the first half of the turn-on period, the electric current path from the positive pole (+) of the power source 20 to the negative pole (−) of the power source 20 through the reactor 10 and the MOSFET 100 is continuously formed, and an amount of an electric current which flows through the electric current path is increased than an amount of an electric current which flows through the electric current path during the first half of the turn-on period (see FIG. 8A).

In the MOSFET 100, electrons continuously flow in the n-type column region 114 from the source electrode 130, and electron density of electrons stagnating in the low electric field region 136 is increased. Then, electrons stagnating in the low electric field region 136 flows out toward a lower side of the low electric field region 136 due to an electron density gradient, flows out from the low electric field region

136 and, thereafter, flows toward a drain electrode side as a drift current by an electric field (see FIG. 8B).

In the rectifier element 30, a depletion layer starts to expand from a PN junction surface so that holes cannot move from the anode electrode to the cathode electrode and electrons cannot move from the cathode electrode to the anode electrode (see FIG. 8C). In this case, the holes move to an anode electrode side and the electrons move to a cathode electrode side thus generating a reverse recovery current (see FIG. 8C).

In the case of the MOSFET of Comparative example, usually, an approximately uniform electric field is formed between the drain and the source due to a drain-source potential difference, electrons receive a Coulomb force due to this electric field and the electrons flow as a drift current. On the other hand, in the case of the MOSFET 100 of Embodiment 1, electrons stagnate in the low electric field region 136, electrons flow out from the low electric field region 136 toward the drain electrode as a diffusion current, move out from the low electric field region 136 and, thereafter, receive a Coulomb force so that electrons flow as a drift current. Accordingly, the manner of the flow of an electric current differs between the MOSFET 100 of Embodiment 1 and the MOSFET of Comparative example.

(4) ON State

When the MOSFET assumes an ON state, in the power conversion circuit 1, in the same manner as the second half of the turn-on period, the electric current path, from the positive pole (+) of the power source 20 to the negative pole (−) of the power source 20 through the reactor 10 and the MOSFET 100, is formed, and an electric current continuously flows in the electric current path (see FIG. 9A). On the other hand, an electric current does not flow in the rectifier element 30.

Figure 9B:
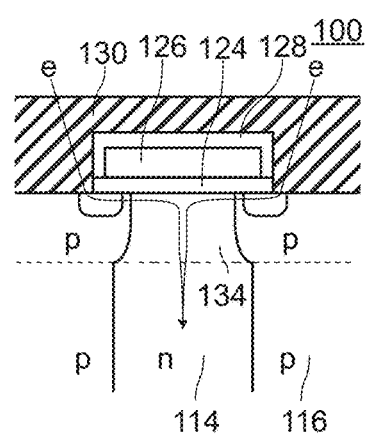

In the MOSFET 100, electrons stagnating in the low electric field region 136 assume a state where the electrons reach the drain electrode and hence, a state is brought about where the source electrode and the drain electrode are steadily electrically connected (see FIG. 9B).

Figure 9C:
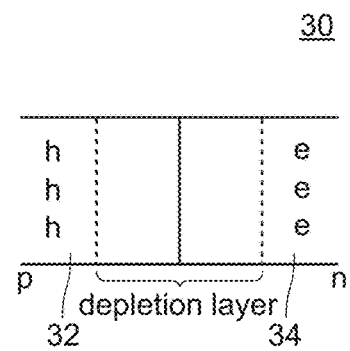

In the rectifier element 30, in the same manner as the second half of the turn-on period, a depletion layer expands from a PN junction surface so that an electric current does not flow (see FIG. 9C).

5. Advantageous Effect Acquired by MOSFET 100 and Power Conversion Circuit 1 According to Embodiment 1

According to the MOSFET 100 and the power conversion circuit 1 of Embodiment 1, the MOSFET 100 is configured to be operated in response to turning on of the MOSFET such that, at a center of the n-type column region 114 as viewed in a plan view, the low electric field region 136, having lower field intensity than areas of the n-type column region 114 other than the center of the n-type column region 114, appears. Accordingly, electrons in the low electric field region 136 minimally move and hence, an increment of a drain current Id per unit time can be made small. As a result, even when a reverse recovery current from the rectifier element 30 flows into the MOSFET 100, it is possible to make oscillation in the MOSFET 100 minimally occur and, at the same time, a surge voltage of the rectifier element 30 can be decreased.

In the MOSFET 100 of Embodiment 1, a surge voltage of the rectifier element 30 can be decreased due to the following reason.

When the MOSFET is turned on, a surge voltage attributed to parasitic inductance of a wiring portion of the power conversion circuit is applied to the rectifier element 30. According to the MOSFET 100 of Embodiment 1, when the MOSFET is turned on, as described previously, an increment of a drain current Id per unit time becomes small and hence, a voltage applied to the rectifier element 30 is relatively moderately increased. As a result, a surge voltage of the rectifier element 30 can be decreased.

Accordingly, the rectifier element 30 of Embodiment 1 can easily satisfy a standard for a surge voltage of a rectifier element required in a power conversion circuit. As a result, the MOSFET 100 of Embodiment 1 and the rectifier element 30 of Embodiment 1 become a MOSFET and a rectifier element applicable to various power conversion circuits.

Further, according to the MOSFET 100 and the power conversion circuit 1 of Embodiment 1, the semiconductor base substrate 110 is configured such that a total amount of a dopant in the p-type column regions 116 is set higher than a total amount of a dopant in the n-type column regions 114 (the total amount of a dopant in the p-type column regions 116 is higher than the total amount of a dopant in the n-type column regions 114). Accordingly, (1) when the MOSFET is turned off, the n-type column region 114 is easily depleted and hence, a time necessary for turning off the MOSFET can be shortened whereby a turn-off loss can be made small. Further, (2) when the MOSFET is turned off, holes in the n-type column region 114 can be easily extracted to the source electrode 130 and hence, it is possible to make avalanche breakdown minimally occur.

According to the MOSFET and the power conversion circuit of Embodiment 1, the MOSFET includes the semiconductor base substrate 110 where a super junction structure is formed of the n-type column regions 114 and the p-type column regions 116. Accordingly, in the same manner as the conventional MOSFET 900, it is possible to provide a switching element having low ON resistance and high withstand voltage.

In the MOSFET of Embodiment 1, a total amount of a dopant in the p-type column regions 116 is set in a range of 1.05 times to 1.15 times as much as a total amount of a dopant in the n-type column regions 114. With such a structure, when the MOSFET is turned on, the n-type column region 114 can be easily depleted. Accordingly, the low electric field region 136 having lower field intensity easily appears at the center of the n-type column region 114 as viewed in a plan view than areas of the n-type column region 114 other than the center of the n-type column region 114, and a withstand voltage of the MOSFET is increased when the MOSFET is turned off.

A total amount of a dopant in the p-type column region 116 is set in a range of 1.05 times to 1.15 times as much as a total amount of a dopant in the n-type column region due to the following reason. That is, in the case where a total amount of a dopant in the p-type column region 116 is set to less than 1.05 times as much as a total amount of a dopant in the n-type column region 114, when the MOSFET is turned on, the low electric field region 136 hardly appears at the center of the n-type column region 114 as viewed in a plan view, while when a total amount of a dopant in the p-type column region 116 becomes more than 1.15 times as much as a total amount of a dopant in the n-type column region 114, when the MOSFET is turned off, it is difficult to increase a withstand voltage of the MOSFET. From these points of view, it is preferable that a total amount of a dopant in the p-type column region 116 be set in a range of 1.05 times to 1.12 times as much as a total amount of a dopant in the n-type column region 114.

In the MOSFET according to Embodiment 1, the MOSFET is a planar-gate-type MOSFET and hence, when the MOSFET is turned on, the MOSFET is operated such that the low electric field region 136 appears at a position relatively remote from the drain electrode 132. Accordingly, it takes time until electrons which stagnate in the low electric field region 136 reach the drain electrode 132 due to diffusion of electrons and hence, an increment of a drain current Id can be made further small. As a result, even when a reverse recovery current from the rectifier element 30 flows in the MOSFET 100, it is possible to make oscillation in the MOSFET 100 minimally occur with more certainty and, at the same time, a surge voltage of the rectifier element 30 can be further decreased.

Further, in the MOSFET according to Embodiment 1, the semiconductor base substrate 110 has the n-type surface high concentration diffusion regions 134 each of which is formed on a portion of the surface of the n-type column region 114 where the base region 118 is not formed. Accordingly, when the MOSFET is turned on, the depletion layer formed of a PN junction surface between the n-type column region 114 and the base region 118 minimally disappears. Accordingly, the low electric field region 136 is easily formed in the n-type column region 114.

According to the MOSFET of Embodiment 1, in the p-type column region 116, in a depth direction of the p-type column region 116, a width of the p-type column region 116 is increased as the p-type column region 116 extends from a deep portion of the p-type column region 116 toward a surface of the p-type column region 116 and hence, when the MOSFET is turned off, holes around the gate can be easily extracted. As a result, an L-load avalanche breakdown resistance can be increased.

According to the power conversion circuit 1 of Embodiment 1, the rectifier element 30 is a fast recovery diode and hence, when the MOSFET 100 is turned on, a loss attributed to a reverse recovery current can be decreased.

[Modification]

Figure 10:
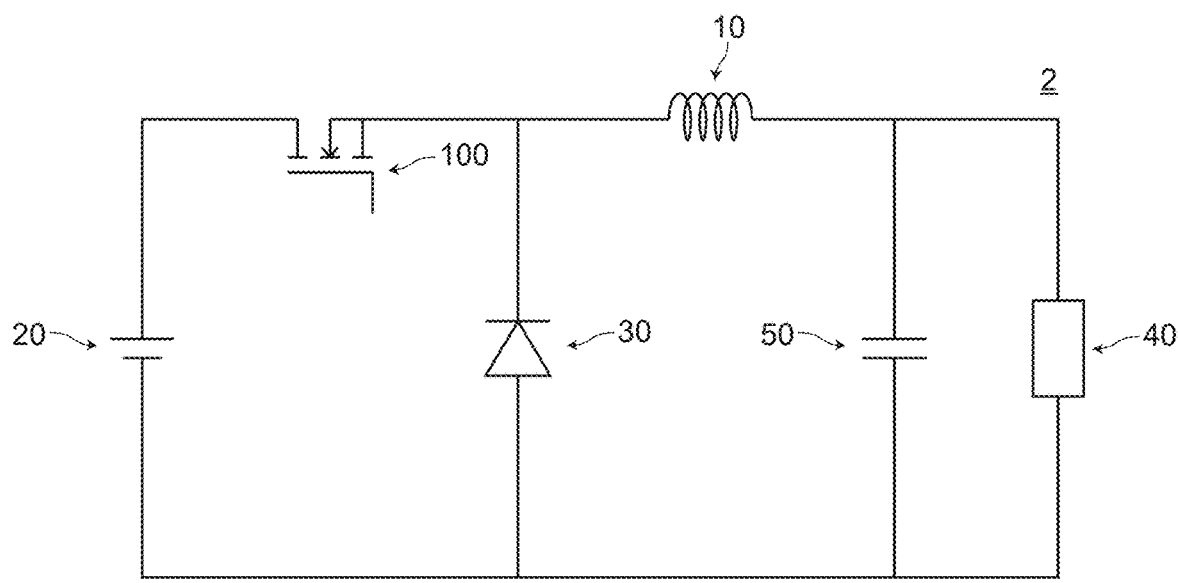
FIG. 10 is a circuit diagram showing a power conversion circuit 2 according to Modification 1.
Figure 11:
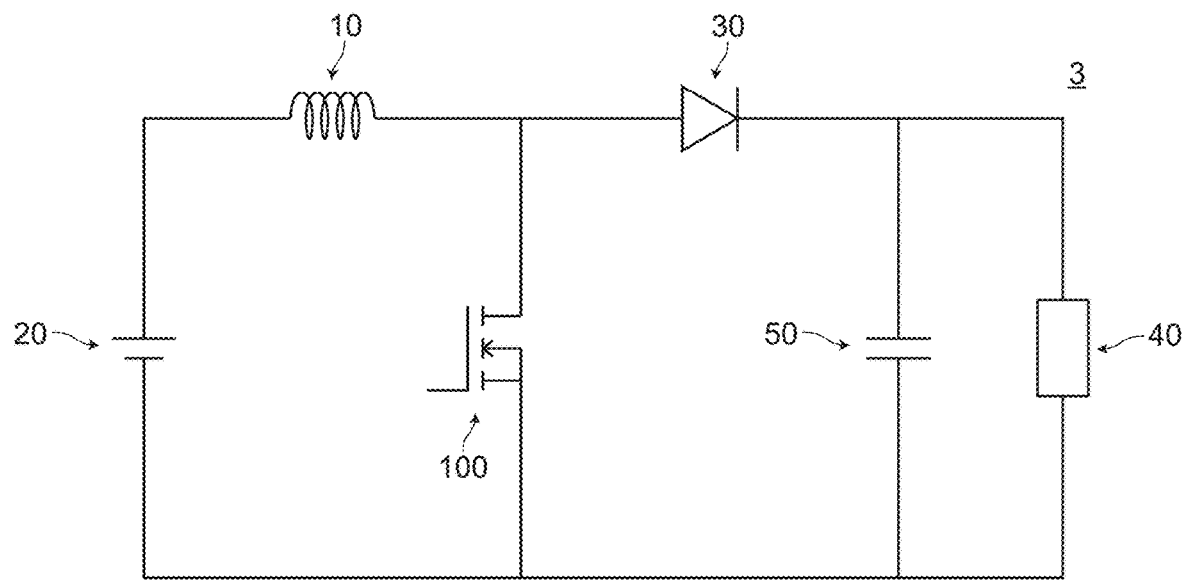
FIG. 11 is a circuit diagram showing a power conversion circuit 3 according to Modification 2.

A power conversion circuit 2 according to a first modification and a power conversion circuit 3 according to Modification 2 basically have the structures substantially same to the structures of the power conversion circuit 1 according to the embodiment. However, the power conversion circuit 2 according to Modification 1 and the power conversion circuit 3 according to Modification 2 differ from the power conversion circuit 1 according to the embodiment with respect to positional relationships of the respective constitutional elements. That is, the power conversion circuit 2 according to Modification 1 is a step-down chopper circuit as shown in FIG. 10, and the power conversion circuit 3 according to Modification 2 is a step-up chopper circuit as shown in FIG. 11.

In this manner, the power conversion circuit 2 according to Modification 1 and the power conversion circuit 3 according to Modification 2 differ from the power conversion circuit 1 according to Embodiment 1 with respect to the positional relationships of the respective constitutional elements. However, in the same manner as the power conversion circuit 1 according to Embodiment 1, the power conversion circuit 2 according to Modification 1 and the power conversion circuit 3 according to Modification 2 are configured to be operated in response to turning on of the MOSFET such that, at a center of an n-type column region 114 as viewed in a plan view, a low electric field region 136, having lower field intensity than areas of the n-type column region 114 other than the center of the n-type column region 114, appears. Accordingly, electrons in the low electric field region 136 minimally move and hence, an increment of a drain current Id per unit time can be made small. As a result, even when a reverse recovery current from a rectifier element 30 flows into the MOSFET 100, it is possible to make oscillation in the MOSFET 100 minimally occur and, at the same time, a surge voltage of the rectifier element 30 can be decreased.

Embodiment 2

Figure 12:
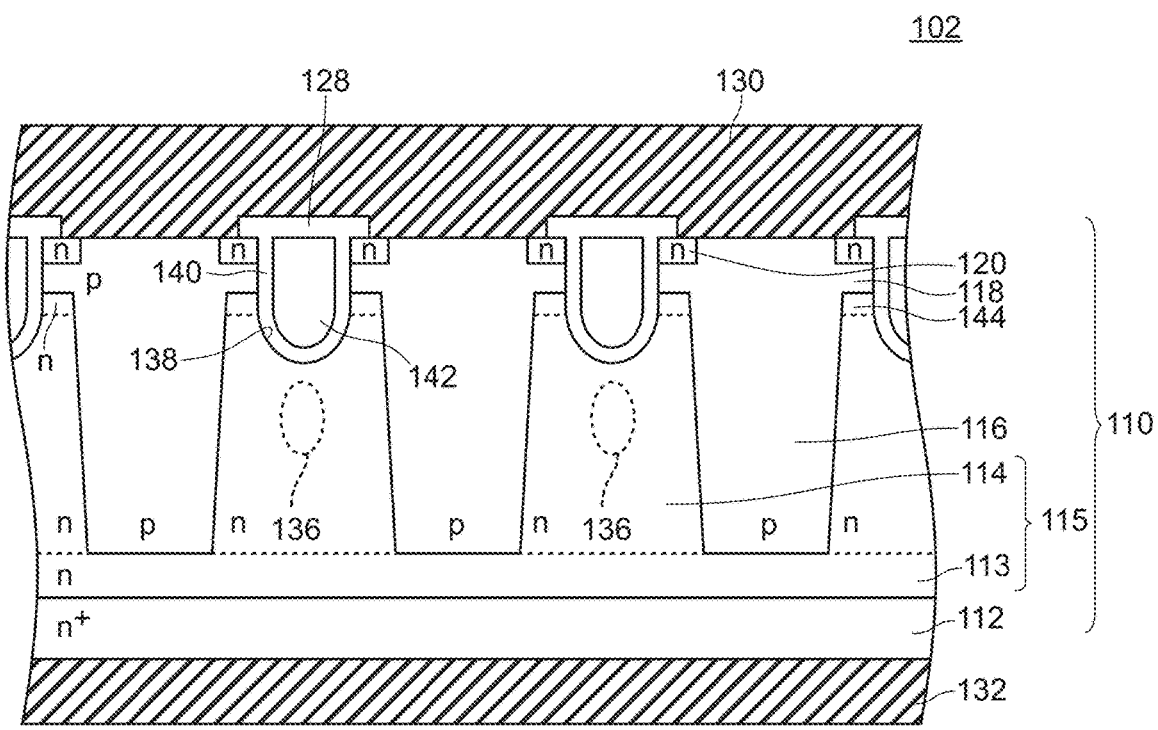
FIG. 12 is a cross-sectional view showing a MOSFET 102 according to Embodiment 2.

A MOSFET 102 according to Embodiment 2 basically has the structure substantially same to the structure of the MOSFET 100 according to Embodiment 1. However, the MOSFET 102 according to Embodiment 2 differs from the MOSFET 100 according to Embodiment 1 with respect to a point where the MOSFET 102 according to Embodiment 2 is not a planar-gate-type MOSFET but is a trench-gate-type MOSFET. That is, in the MOSFET 102 according to Embodiment 2, as shown in FIG. 12, a semiconductor base substrate 110 includes: a p-type base region 118 formed on surfaces of n-type column regions 114 and surfaces of p-type column regions 116; and n-type source regions 120 formed on a surface of the base region 118, and the MOSFET 102 according to Embodiment 2 is a trench-gate-type MOSFET which further includes: a trench 138 which is formed so as to reach a depth position deeper than a deepest portion of the base region 118 in a region where the n-type column region 114 is positioned as viewed in a plan view, and a portion of the source region 120 is exposed on an inner peripheral surface of the trench 138; and a gate electrode 142 which is embedded in the inside of the trench 138 by way of a gate insulation film 140 formed on an inner peripheral surface of the trench 138.

In the MOSFET 102 according to Embodiment 2, the semiconductor base substrate 110 further includes a high concentration dopant region 144 which is formed in an area deeper than a bottommost portion of the base region 118 and shallower than a bottommost portion of the trench 138. Dopant concentration in the high concentration dopant region 144 is set higher than dopant concentration in the n-type column region 114.

In the MOSFET 102 according to Embodiment 2, when the MOSFET is turned on, the low electric field region 136 appears below the trench 138.

In this manner, the MOSFET 102 according to Embodiment 2 differs from the MOSFET 100 according to Embodiment 1 with respect to the point that the MOSFET 102 according to Embodiment 2 is not a planar-gate-type MOSFET but is a trench-gate-type MOSFET. However, in the same manner as the MOSFET 100 according to Embodiment 1, the MOSFET 102 according to Embodiment 2 is configured to be operated such that, in response to turning on of the MOSFET, at a center of the n-type column region 114 as viewed in a plan view, a low electric field region 136, having lower field intensity than areas of the n-type column region 114 other than the center of the n-type column region 114, appears. Accordingly, electrons in the low electric field region 136 minimally move and hence, an increment of a drain current Id per unit time can be made small. As a result, even when a reverse recovery current from a rectifier element 30 flows into the MOSFET 100, it is possible to make oscillation in the MOSFET 100 minimally occur and, at the same time, a surge voltage of the rectifier element 30 can be decreased.

Further, in the MOSFET 102 according to Embodiment 2, the semiconductor base substrate 110 further includes the high concentration dopant region 144 which is formed in the area deeper than the bottommost portion of the base region 118 and shallower than the bottommost portion of the trench 138 and hence, when the MOSFET is turned on, a depletion layer which is formed of a PN junction surface between the n-type column region 114 and the base region 118 minimally disappears. Accordingly, the low electric field region 136 easily appears in the n-type column region 114.

The MOSFET 102 according to Embodiment 2 has the structure substantially same to the structure of the MOSFET 100 according to Embodiment 1 with respect to points other than the point where the MOSFET 102 according to Embodiment 2 is not a planar-gate-type MOSFET but is a trench-gate-type MOSFET and hence, the MOSFET 102 according to Embodiment 2 acquires advantageous effects corresponding to those of the MOSFET 102 according to Embodiment 2, among advantageous effects which the MOSFET 100 according to Embodiment 1 possesses.

Embodiment 3

Figure 13:
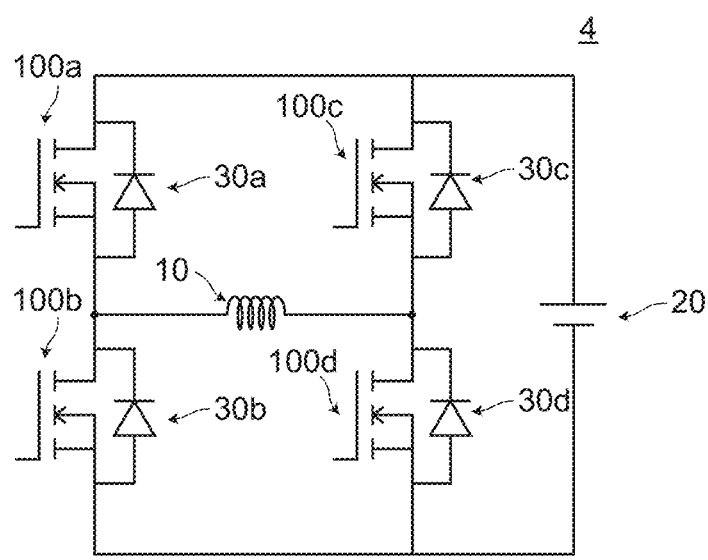
FIG. 13 is a circuit diagram showing a power conversion circuit 4 according to Embodiment 3.
Figure 14:
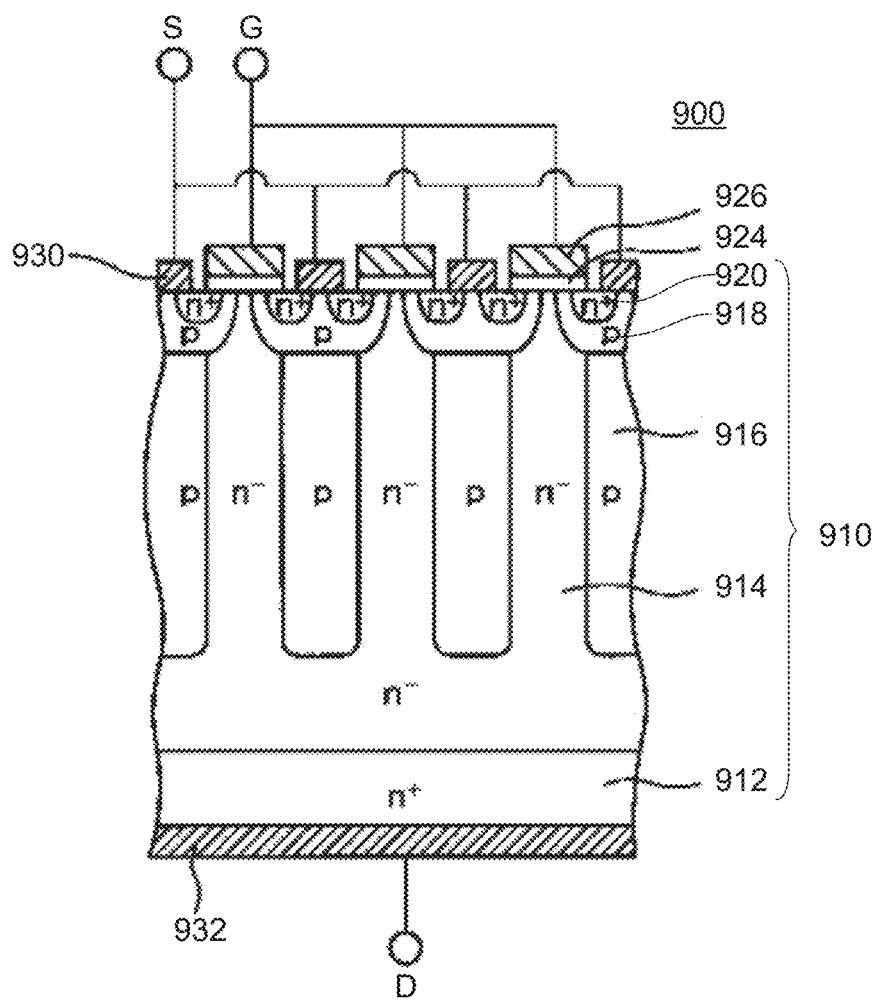
FIG. 14 is a cross-sectional view showing a conventional MOSFET 900. Symbol 912 indicates a low-resistance semiconductor layer.

A power conversion circuit 4 according to Embodiment 3 basically has the structure substantially same to the structure of the power conversion circuit 1 according to Embodiment 1. However, the power conversion circuit 4 according to Embodiment 3 differs from the MOSFET 100 according to Embodiment 1 with respect to a point where the power conversion circuit is a full bridge circuit. That is, as shown in FIG. 13, the power conversion circuit 4 according to Embodiment 3 is a full bridge circuit which includes four MOSFETs 100 as the MOSFET, and also includes built-in diodes of the respective MOSFETs as rectifier elements.

As described above, the power conversion circuit 4 according to Embodiment 3 differs from the power conversion circuit 1 according to Embodiment 1 with respect to the point where the power conversion circuit is a full bridge circuit. However, in the same manner as the power conversion circuit 1 according to Embodiment 1, the power conversion circuit 4 according to Embodiment 3 is operated such that, in response to turning on of the MOSFET, at a center of an n-type column region 114 as viewed in a plan view, a low electric field region 136 having lower field intensity than areas of the n-type column region 114 other than the center of the n-type column region 114 appears. Accordingly, electrons in the low electric field region 136 minimally move and hence, an increment of a drain current Id per unit time can be made small. As a result, even when a reverse recovery current flows from a rectifier element 30 flows into the MOSFET 100, it is possible to make oscillation in the MOSFET 100 minimally occur and, at the same time, a surge voltage of the rectifier element 30 can be decreased.

Further, according to the power conversion circuit 4 of Embodiment 3, the rectifier element is the built-in diode of the MOSFET and hence, it is unnecessary to prepare the other rectifier element as an additional part.

The power conversion circuit 4 according to Embodiment 3 has the structure substantially same to the structure of the power conversion circuit 1 according to Embodiment 1 with respect to points other than the point where the power conversion circuit is a full bridge circuit. Accordingly, the power conversion circuit 4 according to Embodiment 3 acquires advantageous effects corresponding to those of the power conversion circuit 4 according to Embodiment 3, among advantageous effects which the power conversion circuit 1 according to Embodiment 1 possesses.

Although the present invention has been described based on the above-mentioned embodiments, the present invention is not limited to the above-mentioned embodiments. The present invention can be carried out in various modes without departing from the gist of the present invention, and, for example, the following modifications are also possible.

(1) The number, materials, shapes, positions, sizes and the like of the constitutional elements described in the above-mentioned embodiments are provided for an exemplifying purpose, and these matters can be changed in various modes within a scope where advantageous effects of the present invention are not impaired.

(2) In the above-mentioned respective embodiments, the p-type column region 116 is configured such that a width of the p-type column region 116 is increased as the p-type column region 116 extends from a deep portion of the p-type column region 116 toward a surface of the p-type column region 116. However, the present invention is not limited to such a structure. The width of the p-type column region 116 may be set to a fixed value in the depth direction of the p-type column region 116.

(3) In the above-mentioned respective embodiments, in the p-type column region 116, dopant concentration in the p-type column region 116 is set to a fixed value regardless of a depth of the p-type column region 116. However, the present invention is not limited to such a structure. In the p-type column region 116, dopant concentration of the p-type column region may be gradually increased as the p-type column region extends from a deep portion of the p-type column region toward a surface of the p-type column region. With such a structure, it is possible to acquire an advantageous effect that an L-load avalanche breakdown resistance can be increased.

(4) In the above-mentioned respective embodiments, the n-type column regions 114, the p-type column regions 116, and the gate electrodes 126 are formed in a stripe shape as viewed in a plan view. However, the present invention is not limited to such a structure. The n-type column regions 114, the p-type column regions 116, and the gate electrodes 126 may be formed in a circular shape (in a columnar shape as viewed stereoscopically), a quadrangular frame shape, a circular frame shape, a circular grid shape or the like as viewed in a plan view.

(5) In the above-mentioned respective embodiments, a DC power source is used as the power source. However, the present invention is not limited to such a structure. An AC power source may be also used as the power source.

(6) A chopper circuit is used as the power conversion circuit in the above-mentioned respective Embodiments 1 to 3, and a full bridge circuit is used as the power conversion circuit in the above-mentioned Embodiment 4. However, the present invention is not limited to such structures. As the power conversion circuit, a half bridge circuit, a three-phase AC converter, a non-insulation-type full bridge circuit, a non-insulation-type half bridge circuit, a push-pull circuit, an RCC circuit, a forward converter, a fly-back converter or other circuits may be used.

(7) A PIN diode is used as the rectifier element in the above-mentioned Embodiments 1 and 2, and a built-in diode of the MOSFET is used as the rectifier element in the above-mentioned Embodiment 3. However, the present invention is not limited to such structures. As the rectifier element, a JBS, an MPS, or other fast recovery diodes, a silicon-carbide Schottky barrier diode or other diodes may be used.

(8) In the above-mentioned Embodiment 3, only a built-in diode of the MOSFET is used as the rectifier element. However, the present invention is not limited to such a structure. When a recovery loss of the built-in diode is excessively large or the like, a rectifier element provided as an additional part may be connected to the MOSFET in parallel.

The invention claimed is:

1. A MOSFET used in a power conversion circuit which includes at least: a reactor; a power source which supplies an electric current to the reactor; the MOSFET for controlling an electric current supplied from the power source to the reactor; and a rectifier element which performs a rectifying operation of the electric current supplied from the power source to the reactor or an electric current from the reactor, wherein the MOSFET comprises a semiconductor base substrate having an n-type column region and a p-type column region, the n-type column region and the p-type column region forming a super junction structure, the n-type column region and the p-type column region are formed such that a total amount of a dopant in the p-type column region is set higher than a total amount of a dopant in the n-type column region, and the MOSFET is configured to be operated in response to turning on of the MOSFET such that at a center of the n-type column region as viewed in a plan view, a low electric field region having lower field intensity than areas of the n-type column region other than the center of the n-type column region appears.

2. The MOSFET according to claim 1, wherein the total amount of the dopant in the p-type column region is set in a range of 1.05 times to 1.15 times as much as the total amount of the dopant in the n-type column region.

3. The MOSFET according to claim 1, wherein the semiconductor base substrate further includes: a p-type base region formed on a surface of a portion of the n-type column region and a whole surface of the p-type column region; and an n-type source region formed on a surface of the base region, and the MOSFET is a planar-gate-type MOSFET which further includes a gate electrode formed on the base region sandwiched between the source region and the n-type column region by way of a gate insulation film.

4. The MOSFET according to claim 3, wherein the semiconductor base substrate further includes an n-type surface high concentration diffusion region formed on a portion of the surface of the n-type column region where the base region is not formed.

5. The MOSFET according to claim 1, wherein the semiconductor base substrate further includes: a p-type base region formed on a surface of the n-type column region and a surface of the p-type column region; and an n-type source region formed on a surface of the base region, and the MOSFET is a trench-gate-type MOSFET which further includes: a trench where the trench is formed so as to reach a depth position deeper than a deepest portion of the base region in a region where the n-type column region is positioned as viewed in a plan view, and a portion of the source region is exposed on an inner peripheral surface of the trench; and a gate electrode embedded in the inside of the trench by way of a gate insulation film formed on the inner peripheral surface of the trench.

6. The MOSFET according to claim 5, wherein the semiconductor base substrate has an n-type high concentration dopant region which is formed in a region deeper than a bottommost portion of the base region and shallower than a bottommost portion of the trench.

7. The MOSFET according to claim 1, wherein the p-type column region has the structure where a width of the p-type column region is gradually increased as the p-type column region extends from a deep portion of the p-type column region toward a surface of the p-type column region.

8. The MOSFET according to claim 1, wherein the p-type column region has the structure where dopant concentration in the p-type column region is gradually increased as the p-type column region extends from a deep portion of the p-type column region toward a surface of the p-type column region.

9. A power conversion circuit comprising at least:

a reactor;

a power source which supplies an electric current to the reactor;

the MOSFET according to claim 1 for controlling an electric current supplied from the power source to the reactor; and a rectifier element which performs a rectifying operation of the electric current supplied from the power source to the reactor or an electric current from the reactor.

10. The power conversion circuit according to claim 9, wherein the rectifier element is a fast recovery diode.

11. The power conversion circuit according to claim 9, wherein the rectifier element is a built-in diode of the MOSFET.

12. The power conversion circuit according to claim 9, wherein the rectifier element is a silicon-carbide Schottky barrier diode.

* * * * *